United States Patent [19]

Liang

[11] Patent Number: 5,532,612

[45] Date of Patent: Jul. 2, 1996

[54] METHODS AND APPARATUS FOR TEST AND BURN-IN OF INTEGRATED CIRCUIT DEVICES

[76] Inventor: Louis H. Liang, 10601 Creston Dr., Los Altos, Calif. 94024-7420

[21] Appl. No.: 277,223

[22] Filed: Jul. 19, 1994

[51] Int. Cl.⁶ .................................................. G01R 31/02
[52] U.S. Cl. ............................................ 324/760; 324/754
[58] Field of Search ...................................... 324/754, 760

[56] References Cited

U.S. PATENT DOCUMENTS

| | | | |
|---|---|---|---|
| 3,401,126 | 9/1968 | Miller et al. | 252/514 |
| 3,429,040 | 2/1969 | Miller | 29/626 |
| 4,017,889 | 4/1977 | Miller | 357/67 |
| 4,081,901 | 4/1978 | Miller | 29/630 R |
| 4,673,772 | 6/1987 | Satoh et al. | 174/52 FP |
| 5,006,792 | 4/1991 | Malhi et al. | 324/158 F |
| 5,007,163 | 4/1991 | Pope et al. | 29/840 |
| 5,047,711 | 9/1991 | Smith et al. | 324/158 R |
| 5,060,844 | 10/1991 | Behun et al. | 228/180.2 |
| 5,073,117 | 12/1991 | Malhi et al. | 439/71 |
| 5,147,084 | 9/1992 | Behun et al. | 228/56.3 |
| 5,192,835 | 3/1993 | Bull et al. | 174/260 |
| 5,237,269 | 8/1993 | Aimi et al. | 324/158 R |
| 5,258,648 | 11/1993 | Lin | 257/778 |
| 5,374,893 | 12/1994 | Koopman | 324/754 |

OTHER PUBLICATIONS

P. A. Angelone, "Method For Removing Flip Chips" IBM Tech. Discl. Bull. V.19 No. 7 Dec. 1976 p. 2477.

A. Bry et. al. "Reusable Chip Test Package" IBM Tech. Discl. Bull. V. 22, No. 4, Sep. 1979, pp. 1476–1477.

A. R. Formichelli et al. "Non–Destructive Torsional Chip Removal" IBM Tech. Discl. Bull. V. 26 No. 9 Feb. 1984 pp. 4780–4782.

C. Chiou et al., "Localized Heating of Chip Bonding Pad" IBM Tech. Discl. Bull. V. 9 No. 8 Jan. 1967 pp. 1051–1052.

J. J. Mele, "Joining Solder Contacts to Tinned Contact Fingers" IBM Tech. Discl. Bull., V. 10 No. 8 Jan. 1968, p. 1241.

W. C. Ward, "Low–Temperature Soldered Component Removal" IBM Tech. Discl. Bull. V. 19 No. 7 Dec. 1976 p. 2476.

*Primary Examiner*—Kenneth A. Wieder
*Assistant Examiner*—Kourosh Cyrus Khosravi
*Attorney, Agent, or Firm*—Theodore R. Touw

[57] ABSTRACT

Methods and specially adapted reusable test carriers provide for burn-in test of semiconductor integrated circuit devices and economical production of known good dice (KGD). Methods for temporary flip-chip mounting of IC wafers or dice use a hierarchy of solder melting points in combination with improved reusable carrier substrates. IC chip wafers having high-melting-temperature flip-chip terminals are coated with a predetermined volume of a sacrificial solder having a significantly lower melting temperature. A reusable temporary carrier is provided, in a range of sizes adapted for a wafer, small numbers of IC dice, or an individual die, For full-wafer burn-in, the reusable carrier has edge connector terminals. For testing individual dice or a small number of dice, the reusable carrier has conductive elements in a pattern matching each IC dies terminal pattern. The same or opposite side of the reusable carrier has pins or ball-grid array matching a conventional burn-in socket. A preferred reusable carrier consists of separable parts: a substrate customized to carry specific dice for burn-in, and a "universal" carrier package adapted to fit standard test sockets. After burn-in testing, the known good dice are removed by a low-temperature reflow, and attached to permanent substrates by conventional high-temperature reflow. The test carriers are re-usable after cleaning. A carrier structure similar to the preferred separable structure is specially adapted for testing and/or permanent packaging of IC chips which utilize wire-bond connections.

42 Claims, 9 Drawing Sheets

METHODS AND APPARATUS FOR TEST AND BURN-IN OF INTEGRATED CIRCUIT DEVICES

FIELD OF THE INVENTION

This invention relates to semiconductor integrated circuit devices, and especially to methods and apparatus for burn-in and testing of such devices. It is particularly related to burn-in testing of integrated-circuit wafers or chip dice, to reusable test carriers for temporarily carrying such wafers or dice during burn-in and testing, and to economical production of known-good integrated circuit dice. It is more particularly related to methods and apparatus for temporary mounting of integrated circuit wafers or dice for burn-in and testing using improved reusable carrier substrates in combination with a process employing solder within a hierarchy of melting points.

BACKGROUND OF THE INVENTION

As the complexity and density of integrated circuits have increased, the number of input/output (I/O) terminals has also increased. For example a 32 bit microprocessor may require 130 to 190 I/O terminals, while a 128 bit microprocessor may require 500 to 1000 I/O terminals. The cost of packages for high I/O count devices increases faster than the number of I/O pins. That is, the increased cost is much more than proportional to the increase in pin count. Therefore it is highly desirable to package only known good integrated circuit dice in the expensive high-pin-count packages.

Accordingly, it has become a highly desirable practice by semiconductor device manufacturers to burn-in and test integrated circuit devices before mounting them in their packages and shipping to customers, thereby identifying known good devices. The tests and burn-in are often done at elevated temperatures and/or humidity. Higher stress conditions are used in a desire to ensure that any early failures occur during the burn-in and test and not after shipment of the devices to customers.

It is often desirable to use TAB or flip chip technology for high I/O integrated circuit devices, to allow smaller packages and better interconnection reliability. For IC's made using TAB or flip chip technology, standard conventional test sockets are not usable for the burn-in and testing, as such IC's do not have I/O pins until they are packaged. Also, IC chip dice with TAB bond pads as close as 0.001 or 0.002 inch center-to-center are very difficult to make contact with conventional probe cards. Therefore, it is difficult to adopt the practice of packaging only known good dice that have passed burn-in testing for IC devices using TAB or flip chip technology. Thus a need exists for methods that allow burn-in and testing of IC devices using TAB technology or flip chip technology, to identify known good dice before they are mounted in expensive packages with high I/O count. Methods for burn-in and testing that can eliminate wafer probing from the process are especially needed.

NOTATIONS AND NOMENCLATURE

Ball grid array—(BGA) integrated circuit package format with a two dimensional array of ball or bump contact terminals.

Burn-in—Test operation of circuit devices for screening out weak devices and selecting devices that survive a predetermined minimum of initial operation.

COB—Chip on board, a technology for mounting IC chips directly onto a printed circuit board.

C4—Controlled-collapse chip connection, a known method of flip-chip bonding of IC chips to substrates in which collapse of solder bump connections during solder-reflow is controlled (see Miller, U.S. Pat. Nos. 3,429,040 and 3,495,133).

DCA—Direct chip attach.

Die and dice—An integrated circuit chip after scribing and separating the chips of a wafer but before mounting and interconnecting in a package; the plural is dice.

Flat pack—Integrated circuit package format with a thin profile having leads extending from side surfaces.

Flip chip—A known configuration of packaged integrated circuit chips in which each chip die is mounted with its circuitry facing the package substrate, instead of having its back surface bonded to the package substrate.

Hybrid—Packaging technology with more than one die mounted to each substrate.

KGD—Known good die, the result of a process using 100% burn-in testing of IC dice to screen out weak dice.

MCM—Multi-chip module; more than one IC chip per module package.

Pin grid array—(PGA) integrated circuit package format with a two dimensional array of pins.

Surface mount package—Integrated circuit package format intended to be mounted against a circuit board or card.

TAB—Tape-automated bonding method of forming interconnections to IC chips.

DESCRIPTION OF THE RELATED ART

A number of approaches have been developed for burn-in testing of IC chips using flip chip technology. One approach is to mount the chips onto substrates of their final package, perform the burn-in testing, and then remove failed chips from the substrates, discard them, and reuse or recycle the package substrates. IC's that pass the burn-in testing are shipped to customers. One method of removing the failed chips is to sever the solder bumps with a sharp scalpel-like implement, as in P. A. Angelone "Method for Removing Flip Chips," IBM Technical Disclosure Bulletin Vol. 19, No. 7, Dec. 1976, p. 2477. Another method is to remove the tested chip die from a temporary sacrificial carrier substrate by shearing of its substrate connections, as described for example in A. Formichelli et al., "Non-Destructive Torsional Chip Removal," IBM Technical Disclosure Bulletin Vol. 26, No. 9, Feb. 1984, p. 4780–4782 and Aimi et al. U.S. Pat. No. 5,237,269 (1993). Other methods include removal by heating of the chips and their interconnecting solder bumps above the solder melting-point, combined with mechanical agitation, as in W. C. Ward "Low-Temperature Soldered Component Removal," IBM Technical Disclosure Bulletin Vol. 19, No. 7, Dec. 1976, p. 2476. U.S. Pat. No. 5,007,163 (1991) by Pope et al. describes an approach using an electrically conductive liquid eutectic joint at room temperature, wherein the electrical connections remain liquid during the burn-in testing. In this approach, the eutectic alloy remaining on the chips is removed in a separate operation after completion of burn-in testing. U.S. Pat. No. 5,173,451 (1992) describes a semipermanent electrical connection for semiconductor dice, which is effected by using wire bond techniques and controlling the wire bond parameters so that the bonding force retaining the lead wires to the bond pads is less than the attachment strength of the bond pads to the die, thus allowing removal of lead wires after burn-in and testing.

Another known approach for burn-in of flip-chip devices is to provide a test socket adapter which contacts the interconnection bumps of flip-chip IC dice, using cantilever beams which can deflect and compensate for variations in the heights of peripheral solder bumps, as in U.S. Pat. No. 5,006,792 by Malhi et al.(1991). Another temporary test socket adapter for bare dice is the "QC²" chip carrier available from Fresh Quest Corporation of Gilbert, Ariz., which has a chip support plate, a carrier assembly, a contact assembly, and a spring.

Yet another way to provide for burn-in testing of flip chips is described in U.S. Pat. No. 5,258,648 (1993) by Lin. Lin describes a composite device with an interposer having test contacts formed along its periphery. The test contacts allow for burn-in testing of a device mounted on the interposer, and the interposer remains as part of the IC device package for good devices as shipped.

For burn-in testing of full wafers, U.S. Pat. No. 5,047,711 (1991) by Smith et al. describes contact pads provided on the wafer that extend into scribe-lane (kerf) regions of the wafer.

It appears that three principal approaches to achieve known good die (KGD) processes are currently being pursued by the industry in prototype stages: TAB for fine-pitch peripheral bond pads, KGD test fixtures, and flip-chip attachment to ceramic substrates. In the TAB approach, IC wafers are bumped with gold, aluminum, or copper, or the TAB tapes are bumped. The wafers are then diced and the IC dice are inner-lead bonded (ILB) to the TAB tape. The bonded tapes are singulated and sometimes mounted on TAB carriers for subsequent test, burn-in and outer-lead bonding (OLB) to packages or substrates. The units that failed test or burn-in are discarded and the test TAB tape is not reusable. Since the TAB tape is one of the most expensive components in TAB packaging, this TAB approach is a costly method of achieving a KGD process. Furthermore, TAB test sockets are typically very bulky and therefore take up a lot of space on burn-in boards. The fine-pitch test sockets are also quite expensive. Recent development of area-array TAB or TAB ball grid array (ATAB or TBGA) has reduced the size and cost of test sockets significantly, but peripheral bond pads are still used for ILB, and the TAB tape is not reusable after burn-in and test.

In the approach using KGD test fixtures there are some abrasive test fixtures that pierce through the oxide layer of bumped IC dice, after which the test fixtures are mounted on burn-in boards for burn-in and test. Each test fixture must be personalized for the specific IC. Although the test fixtures are reusable for the specific IC dice, the mechanical complexity raises the per-unit cost to a cost higher than the per-unit cost of TAB tape. Alternative methods using TAB tape or demountable TAB have been tried, but without much success because of limited reusable life or because of size constraint or cost factors.

In the flip-chip approach to achieve KGD with ceramic substrates, the bumped IC dice are first tested in wafer form (using, for example, a special probe card for contacting area array bond pads), then diced and flip-chip mounted on ceramic test carrier packages. The test carriers can be re-used many times and are small and adapted to fit industry standard test sockets. But the ceramic substrate material necessitated by the high melting temperature of C4 solder bumps and the brazing of pins or leads make the test carrier quite expensive. A number of other solder-bump structures and processes are similar to the C4 connection technology.

Variations of this approach have been attempted using solder paste on less expensive organic test carriers, but the applications have been limited by the resolution of solder-paste screening, which cannot currently achieve dense array pads or fine-pitch pads (spacing of less than 0.004 inch).

PROBLEMS SOLVED BY THE INVENTION

This invention reduces IC manufacturing costs by eliminating the reworking and packaging those weak or defective IC devices which do not survive burn-in testing. It obviates the need for costly testing adapter elements added to already expensive IC device packages. It allows burn-in testing of flip-chip IC's with I/O terminals arranged in an array, without wafer probing using expensive membrane probe cards or special fine-pitch array probe cards. It provides an inexpensive reusable test carrier and methods for using and re-using the carrier for economical production of known good dice. The same carrier structure can solve the problem of multiple substrate sizes for wire-bonded IC chips of various die sizes, by providing an economical package usable for a wide range of die sizes.

OBJECTS AND ADVANTAGES OF THE INVENTION

An object of this invention is to provide an economical method of producing known good semiconductor integrated circuit devices. Another object is to provide manufacturing methods especially adaptable to large or complex integrated circuit chips with large numbers of input/output terminals. A related object is to provide such methods suitable for integrated circuit devices having not only peripheral input/output terminals, but also a multiplicity of terminals arranged in an array. Another object is to avoid the use of expensive membrane probe cards or fine-pitch array probe cards in wafer or die testing, by eliminating wafer probing per se altogether from the manufacturing process for many IC's. Another object is to avoid the use of more expensive ceramic test carriers, and to provide test carriers made of less expensive materials. Another object is to provide robust and reliable electrical contacts for burn-in testing. Another object is to reduce the overall cost of packaged integrated circuit devices. A particular related object is to improve the practical economic feasibility of multi-chip modules (MCM) and chip-on-board (COB) products. A related object is to provide efficient methods and apparatus for burn-in and testing of such semiconductor integrated circuit devices. Other objects are to avoid unnecessary rework and to avoid packaging weak or defective IC chips in expensive packages. Another object is to provide improved reusable test carriers for temporary packaging of integrated-circuit wafers or chip dice during burn-in and test. A related object is to provide methods of burn-in testing of full-wafers of IC devices, without requiring additional mask levels in the wafer fabrication for extra contacts. Another object is to provide an integrated circuit module package adaptable to a wide range of IC die sizes for wire-bonded dice. A particular object is to provide methods and apparatus for temporary flip-chip mounting of integrated circuit wafers or dice for burn-in and test using solder within a hierarchy of melting points in combination with improved reusable carrier substrates.

SUMMARY OF THE INVENTION

This invention includes methods and apparatus for burn-in and test of integrated circuit devices. Before burn-in testing, IC chip wafers having high-melting-temperature TAB or flip-chip terminals are coated with a predetermined small portion of a sacrificial solder having a significantly lower melting temperature. The same mask and masking method may be used for this deposition as for the normal high-temperature terminals. A reusable temporary carrier is provided, either in a large size adapted for burn-in testing a full wafer, or in a range of smaller sizes adapted for burn-in testing individual IC chips or small numbers of IC chips per carrier. The reusable carrier has, on one side, conductive elements arranged in a pattern that is a mirror-image of the IC chip terminal pattern. For full-wafer burn-in, the reusable carrier has a multiplicity of such patterns, arranged to match the positions of individual IC chips on the wafer. The same side or opposite side of the reusable carrier has ball grid array terminals matching a suitable available burn-in test socket. Alternate embodiments of the reusable carrier may have pins instead of ball grid array terminals.

Other objects, uses, advantages and features of the invention will become apparent to those skilled in the art from the following descriptions of preferred embodiments.

DETAILED DESCRIPTION OF THE PREFERRED EMBODIMENTS

To perform a preferred process of this invention, the normal processing of semiconductor IC devices is interrupted after the deposition of high-melting-temperature "bumps" for TAB packaging or the deposition of high-temperature solder bumps for flip-chip packaging. These two packaging technologies (TAB and flip-chip) both have metallic contacts characterized by relatively high melting point temperatures, which are normally annealed at a relatively high temperature or subject to an alloying and ball-forming reflow. In the present process, the normal processes of annealing or ball-forming reflow are postponed until after burn-in testing. For individually burned-in dice, those annealing or final reflow processes are performed only on known good dice. For devices on wafers subjected to full-wafer burn-in, those processes are performed for the full wafer, but only known good dice are further processed into final packaging. While the normal processing is of course very different for IC devices having gold bumps for TAB, for example, and for IC devices having high-lead solder bumps for flip-chip bonding, the process of this invention is essentially similar for all such devices. For clarity, this description of the processes will sometimes refer to the conventional bumps of those conventional devices as "high-temperature bumps" or "high-T" bumps whether they be gold bumps or balls or lead-tin solder bumps or balls made with 95% or higher lead content or some other high melting temperature materials. Differences among processes performed on various IC devices will be clarified by reference to drawings illustrating intermediate stages of the respective processes.

Figure 1:
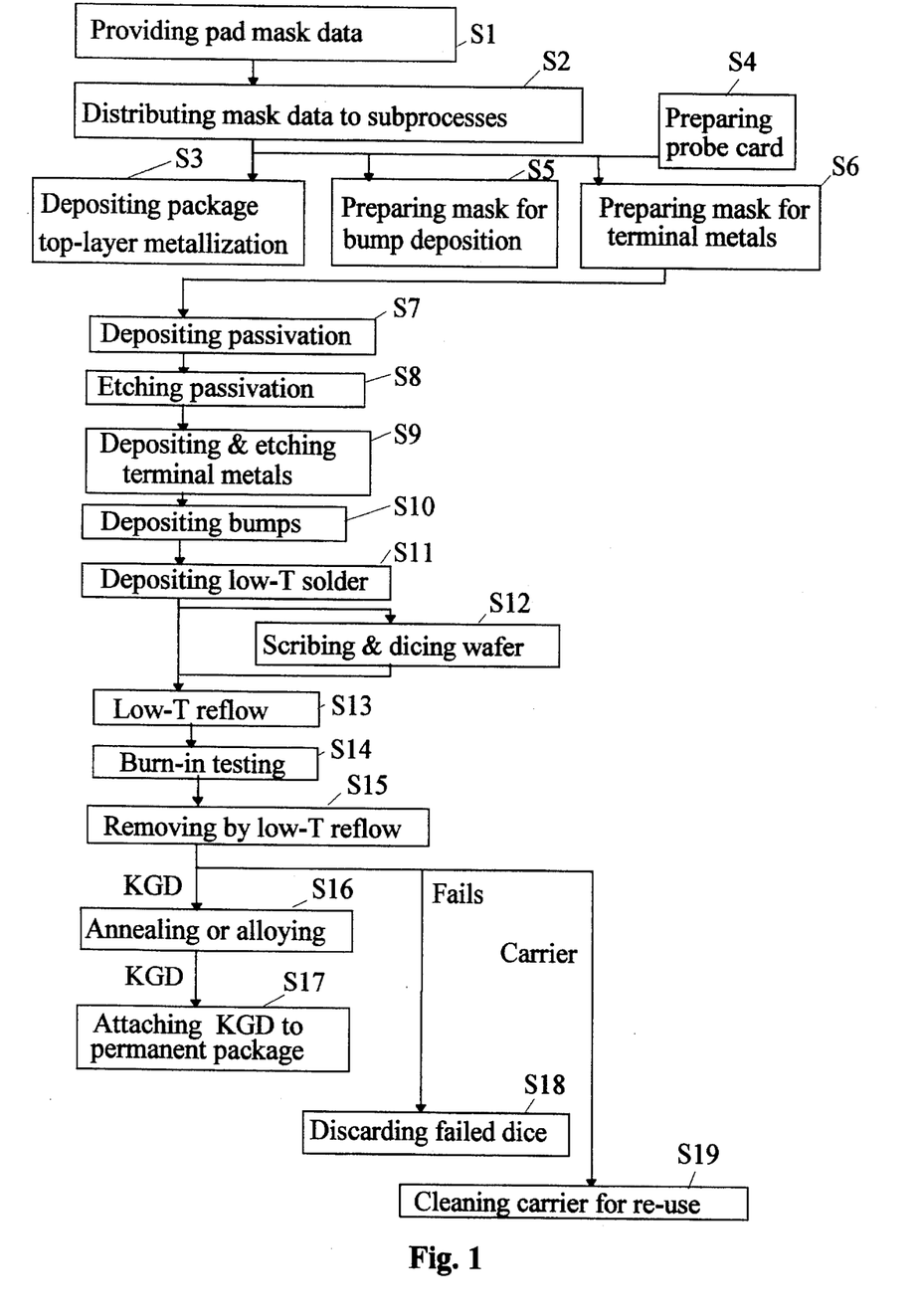
FIG. 1 is a flow diagram illustrating a process flow of a method performed in accordance with this invention.

FIG. 1 is a flow diagram illustrating an overall flow of a process performed in accordance with the invention. Portions of the process of FIG. 1 are conventional processes, needed to describe how to use the process of this invention. This process will be described here mostly in terms of a flip-chip process; variations related to TAB devices will be described below. This process begins (S1) with providing data describing a pad mask and corresponding terminal metal mask(s). Those data are distributed (S2) to support four sub-processes. The four sub-processes are: depositing the packaging substrate's top-layer metallization (S3), preparing a probe card for later testing (S4), preparing deposition masks for high-temperature bumps (S5), and preparing masks for terminal metals (S6). However, it should be noted that while step S4 may be needed in the conventional process, an important advantage of the present invention is eliminating wafer probing, and therefore eliminating step S4, the preparation of an expensive probe card. In the fabrication process flow, it may be required to deposit a passivation layer such as $SiO_2$ or polyimide (S7) and etch a pattern (S8) before depositing and etching terminal metals (S9). High-temperature solder bumps are deposited (S10) using the above-mentioned high-temperature-bump deposition mask. Step S10 is preferably performed by plating, using a photomask and photoresist to define bump contact areas to be plated. For gold bumps, the steps S7 through S10 at least would be different in many details from the corresponding steps for high temperature lead-tin solder bumps.

At this point in a conventional process (after deposition of the high-T bumps but before any annealing or high-T reflow) the above-mentioned interruption occurs, for depositing (S11) (using the same masking method and masks) a predetermined small amount of low-melting-temperature solder used for the present invention. This deposition may be done by a number of alternative methods, including plating, or wave soldering, or evaporation, or sputtering, or beam deposition of constituents of the low-melting temperature solder. The low-melting solder may be any of various low-melting-point binary or ternary alloys of lead, tin, indium, and bismuth for example, such as lead-indium, lead-indium-tin, bismuth-lead-tin, lead-tin eutectic (63% Pb, 37% Sn), or any suitable solder whose melting point is sufficiently lower than the melting point of the high-temperature bumps used on the IC dice. A minimum difference of 50° C. is preferred, i.e. a low-T solder with melting temperature 50° C. lower than that of the high-melting bumps. The relative melting points, not the absolute melting-point temperatures, are important. Another characteristic of a suitable low-temperature solder is that it should not form brittle intermetallic alloys with the high-temperature-bump metals at the temperatures to be employed.

The next step depends on whether burn-in and testing is to be performed on a full wafer or on individual or small numbers of dice. If the full wafer is to be burn-in tested, the wafer 450 is attached (S13) to a wafer-scale temporary reusable substrate made in accordance with this invention and described in detail below. Step S13 of attaching the wafer is performed by aligning wafer 450 and reflowing a low-T solder layer. In cases where the wafer-scale temporary reusable substrate can accommodate two wafers, step S13 may include simultaneous reflow of two wafers. If individual dice or groups of a few dice are to be burned-in, the next step after S11 is scribing and dicing the wafers (S12). Continuing the process description in terms of an individual die: each die 680 is attached (S13) to a temporary reusable carrier by alignment and low-temperature reflow. For either full wafers or individual dice, the low temperature reflow (S13) is performed at a temperature just sufficient to attach wafer 450 or die 680 to the temporary carrier, i.e. at a temperature not so high as to cause significant alloying with the high-T bump material. In other words, a peak temperature of a reflow temperature/time profile should be just sufficient to attach the wafer or die under test. The reflow is preferably performed in a reducing or at least in a nonoxidizing atmosphere.

Once wafers or dice have been mounted to reusable carriers, the burn-in testing is performed (S14). After known good dice are identified by passing the burn-in testing, those known good dice are removed from the reusable test carriers by another low-temperature reflow (S15). The next step for dice having high-temperature solder bumps is an alloying and ball-forming high-temperature reflow (S16). Typically such a reflow cycle for 97% Pb 3% Sn, for example, is a time/temperature profile with peak temperature of 360° C. to 385° C., but wide variations in profiles are commonly practiced by various manufacturers depending on the high-temperature solder bump composition and other variables. The particular time/temperature profile is not critical for practice of the present invention, but of course the profile must be suitable for the particular high-T solder bumps with which this invention is used.

In the case of TAB devices, step S16 consists of a high-temperature annealing of Au bumps. A typical high-temperature anneal for Au bumps is a cycle reaching about 400 C. for about 30 minutes, but again wide variations of annealing cycles in common use are suitable. Known good dice having high-temperature solder bumps are then attached (S17) by high-temperature reflow to their permanent package substrates. In the case of TAB devices, step S17 consists of alignment and TAB bonding instead of reflow. After step S17, a conventional process to complete IC's containing known good dice for shipment is completed.

Those dice not passing burn-in testing ("fails") are removed from their reusable test carriers by a low temperature reflow (S15) and appropriately disposed of (S18). The reusable test carriers are cleaned (S19) for re-use.

The invention will be further clarified by considering the following two examples of process details, which are intended to be purely exemplary of the use of the invention.

Figure 2:
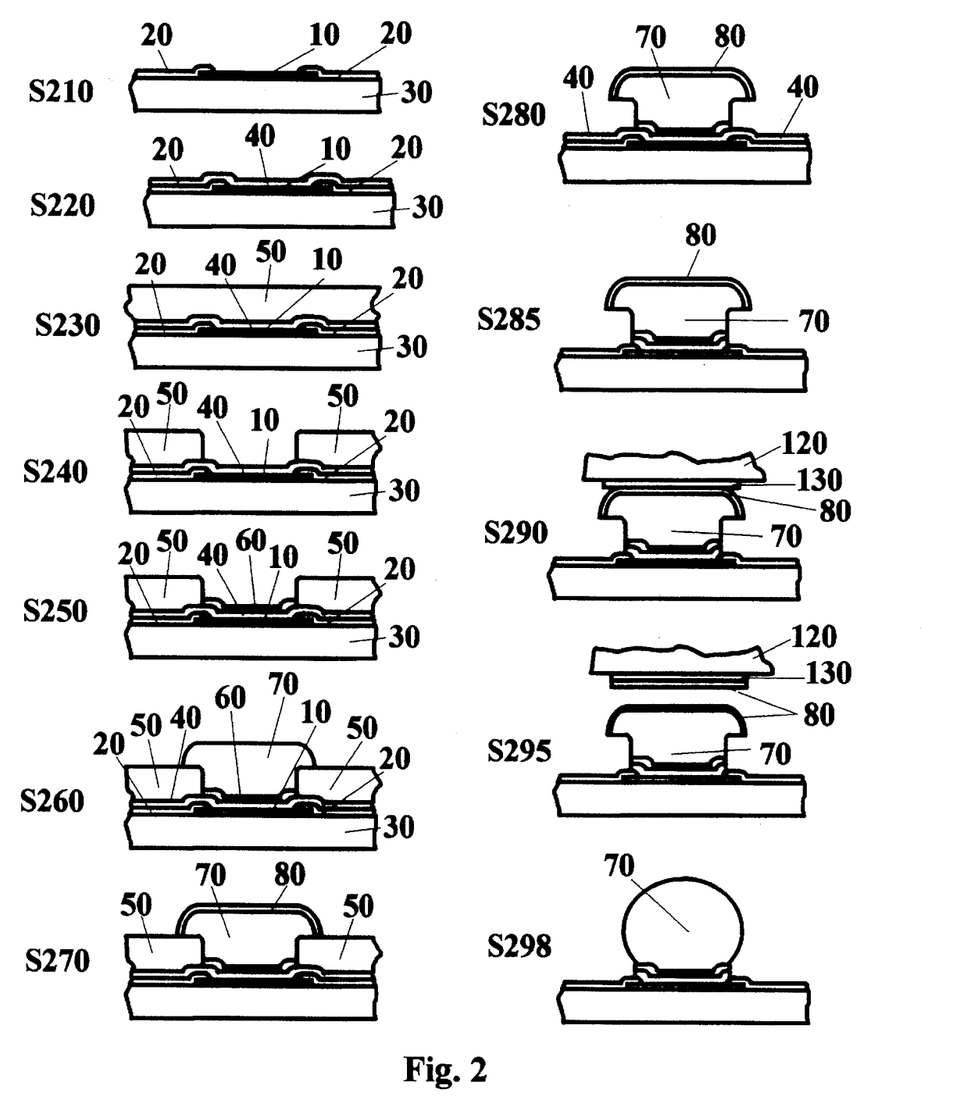
FIG. 2 is a series of cross-section drawings, illustrating intermediate results of a first process method performed in accordance with this invention.

In FIG. 2, the first process method example (for solder bumps) is illustrated by a series of cross-section drawings showing intermediate results of steps of the first process method. At the first step in FIG. 2 (S210), an Al contact pad 10 is provided, with an opening in an $SiO_2$ passivation layer 20 which otherwise covers the IC, including its Si substrate 30 except where opened for contacts. In step S220, a titanium-copper (Ti/Cu) layer 40 is sputtered. A number of other film structures may be deposited instead of Ti/Cu layer 40 in step S220, such as Cr-Cu-Au, Ni/Al, Cr/Au/Ag, or Ni/Cr-Sn/Ag/Ni. In step S230, Ti/Cu layer 40 is covered with a coating of photoresist 50, which is cured or baked as required. Photoresist 50 may be a photosensitive polyimide material, for example, which may require curing as part of step S230 or of step S240, as appropriate to resist material 50. In step S240, photoresist 50 is patterned, and resist is developed out of the contact area. In step S250, Cu 60 is plated onto Ti/Cu 40. In step S260 high-temperature Pb/Sn solder 70 (typically>or equal 90% Pb) is deposited. High-temperature Pb/Sn solder deposition S260 may be done by one of several methods previously mentioned: e.g. by plating. A number of solder-bump structures and processes similar to the C4 connection technology are suitable for use in this process. High-temperature Pb/Sn solder 70 has a characteristic volume $V_h$ at each contact. In step S270, a predetermined small amount, less than $V_h/10$, of a low-temperature solder 80 is deposited. In terms of thickness, high-T solder 70 typically may be 10 to 150 micrometers thick for example, and in that case low-T solder 80 may be typically 1 to 15 micrometers thick. Low-T solder 80 may be Pb/Sn eutectic solder, for example, or another low-T solder such as one of the binary or ternary alloys previously mentioned in connection with step S11. Low-T solder 80 should have a composition to provide a melting point $T_{mlo}$ sufficiently below the melting point $T_{mhi}$ of high-T solder 70. $T_{mlo}$ is preferably at least 50° C. below $T_{mhi}$. Low-T solder 80 may not be a metal or alloy which forms a new alloy with high-T solder 70 at temperature $T_{mlo}$ to form a composition which cannot be reflowed at $T_{mlo}$. Amalgam is an example of such an alloy unsuitable to use for low-T alloy 80.

In step S280, resist 50 is removed. In step S285, residual Cu/Ti layer 40 is stripped. In step S290, low-T solder layer 80 is reflowed at a temperature near $T_{mlo}$ to attach IC die 680 or wafer 450 to a reusable test carrier for burn-in and testing. After burn-in and testing, low-T solder 80 is again reflowed at a temperature near $T_{mlo}$ in step S295, to remove IC die 680 from the reusable test carrier. Neither reflow step S290 nor reflow step S295 changes the cross-section structure significantly, so that the cross-section remains qualitatively as shown after step S285. Quantitatively, the thickness of low-T solder layer 80 is reduced by an amount corresponding to the low-T solder that remains on pads of the reusable test carrier before it is cleaned. Very little low-T solder 80 remains on the high-T bump 70 of die 680. Thus the high-T solder bump 70 is not damaged by low-temperature reflows S290 and S295. For known good dice, high-T solder 70 is reflowed at a temperature above $T_{mhi}$ in step S298 (an alloying and ball-forming reflow which is essentially the same as in the conventional process). Low-T solder layer 80 disappears in the latter step, alloying with high-T solder 80.

Figure 3:
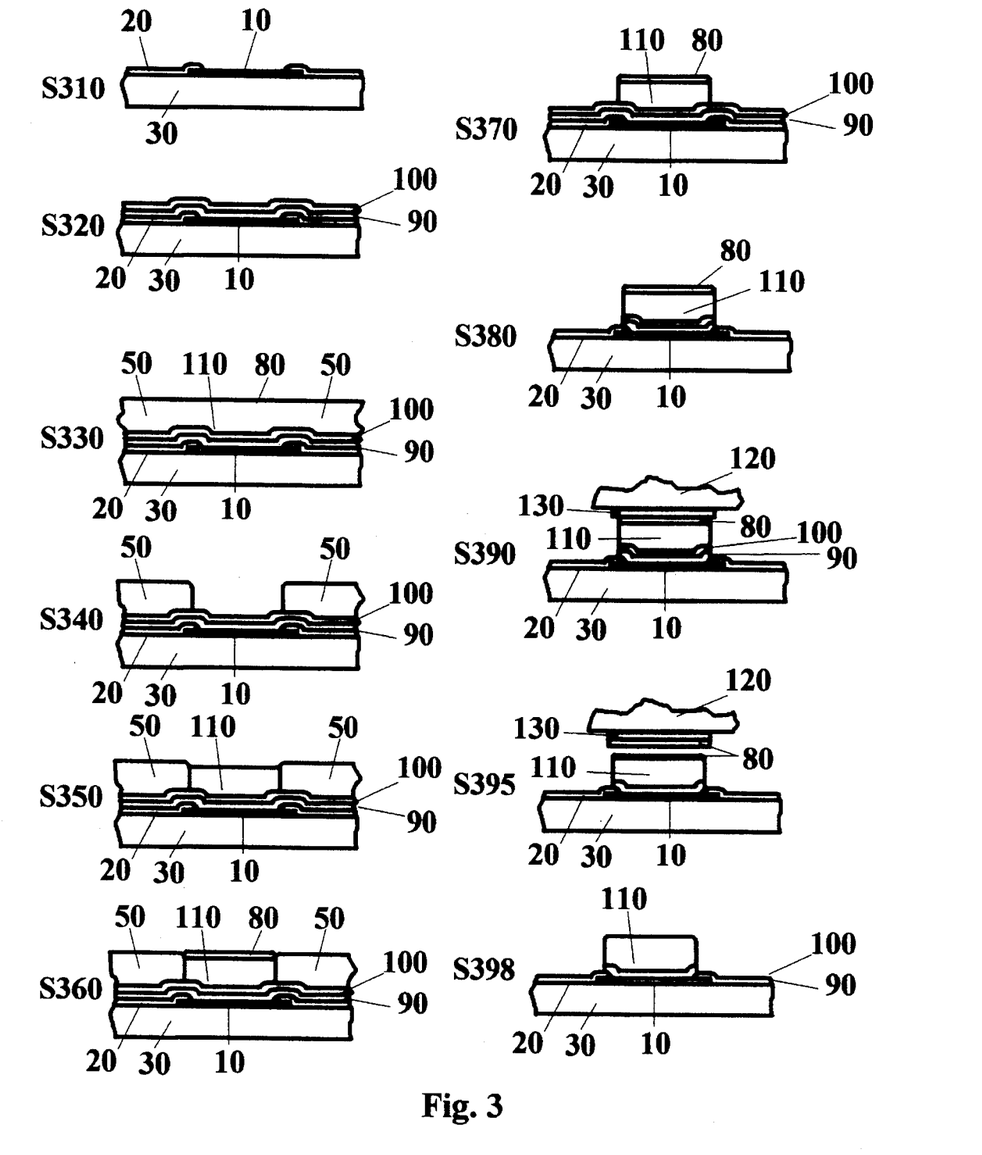
FIG. 3 is a series of cross-section drawings, illustrating intermediate results of a second process method.

FIG. 3 is a series of cross-section drawings, illustrating intermediate results of steps of a second process method (for gold bumps). Steps S310, S330, and S340 in FIG. 3 are the same as the corresponding steps S210, S230 and S240 in FIG. 2. Step S320 differs from step S220 in that a barrier layer 90 of TiW and a seed layer 100 of Au are sputtered over the surface in step S320. In step S350, a gold bump 110 is plated up over the Au seed layer 100. Gold bump 110 has a characteristic volume $V_h$ at each contact. In step S360, a predetermined small amount, less than $V_h/10$, of low-temperature solder 80 is deposited over gold bump 110. Again, low-T solder 80 may not be a metal or alloy which forms another alloy with high-T Au bump 110 at temperature $T_{mlo}$ to attain a composition which cannot be reflowed at $T_{mlo}$.

In step S370, resist 50 is removed. In step S380, residual Au-TiW layers 90 and 100 are stripped. In step S390, low-T solder layer 80 is reflowed at a temperature near $T_{mlo}$ to attach IC die 680 or wafer 450 to a reusable test carrier for burn-in and testing. After burn-in and testing, low-T solder 80 is again reflowed at a temperature near $T_{mlo}$ in step S395, to remove the IC die 680 from the reusable test carrier. Again neither reflow step S390 nor reflow step S395 change the cross-section structure significantly, so that the cross-section remains qualitatively as shown after step S380 although a small amount of low-T solder 80 remains on pads of the reusable test carrier before it is cleaned. For known good dice, high-T Au bumps 110 are annealed at a temperature well above $T_{mlo}$ in step S398, which is essentially the same as the conventional annealing process as described above for step S16.

The processes of FIGS. 1, 2 and 3 are used in conjunction with a reusable test carrier, which will now be described in versions suitable for full wafers and for individual dice or small numbers of dice.

Figure 4:
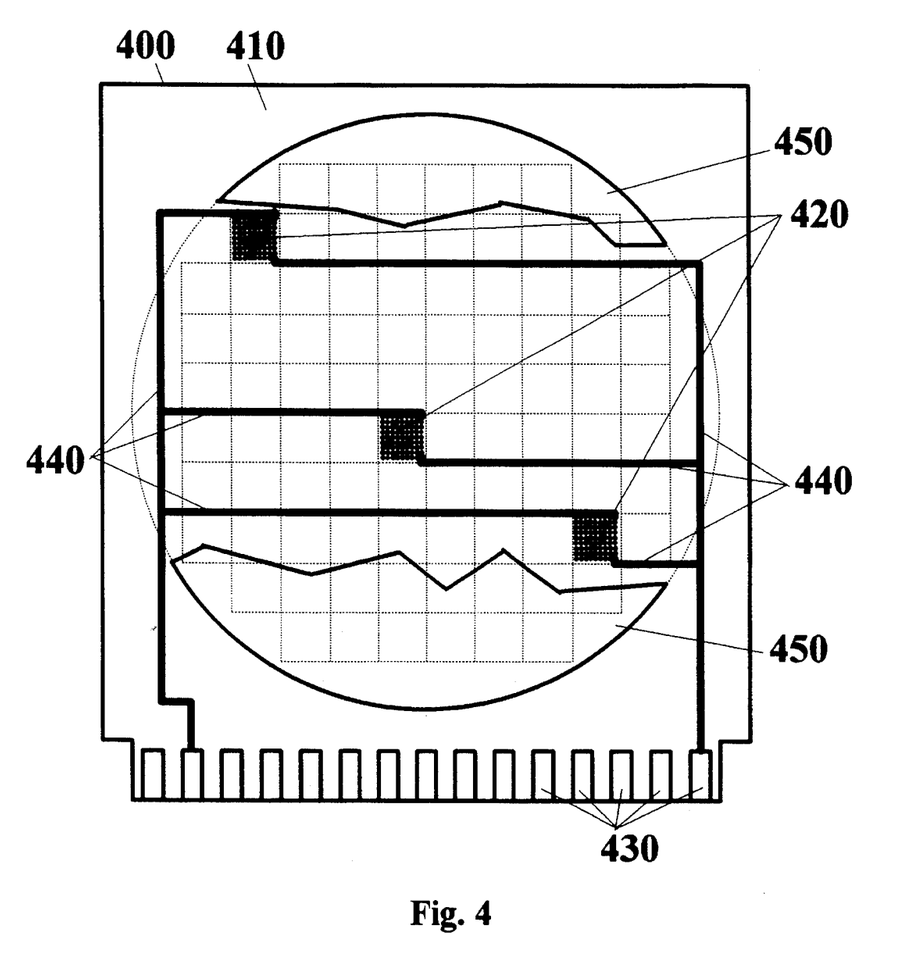
FIG. 4 is a plan view of a burn-in carrier for full wafers, in accordance with this invention.
Figure 5:
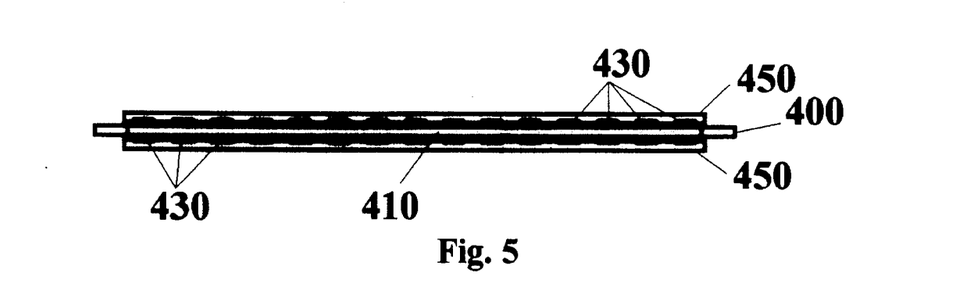
FIG. 5 is a cross-section view of the burn-in carrier of FIG. 4, with wafers under test.

FIG. 4 is a plan view of a reusable burn-in carrier 400 made in accordance with this invention for burn-in of full wafers 450. FIG. 5 is a cross-section view of a preferred embodiment of the burn-in carrier substrate of FIG. 4, with wafers under test 450 mounted on both sides. The reusable burn-in carrier has a substrate 410, preferably made of a material with similar coefficient of thermal expansion to that of silicon wafer 450. Substrate materials with suitable expansion coefficients are silicon carbide, mullite, and Ceracom, for example. (Ceracom is a trade name for a low-cost ceramic composite material available from the Kyocera Corporation of Japan.) Substrate 410 is metallized on one or both sides in a pattern to provide landing pads 420 and edge connector terminals 430, and to provide those connections 440 between them necessary to power all the chips on wafer 450 for burn-in. (Only a few representative portions of the metallization patterns 420, 430 and 440 are shown in FIG. 4.)

When reusable burn-in carrier 400 is used in the KGD process of this invention, a wafer 450 is mounted on it by low temperature reflow as in steps S290 or S390. If burn-in carrier 400 is a type that has metallization on both sides, such as the embodiment illustrated in FIG. 5, a second wafer 450 is mounted on the second side in a simultaneous reflow for both wafers. Edge connectors 430 are inserted into matching sockets wired to provide connections for burn-in testing. After burn-in is completed, wafers 450 are removed by low-temperature reflow as in steps S295 or S395. Conventional wafer sort testing can be used to identify functional known good dice (KGD) if required. The wafers are diced and the known good dice are continued in normal processing for shipment. Burn-in carrier 400 is cleaned if necessary and re-used.

Figure 6A:
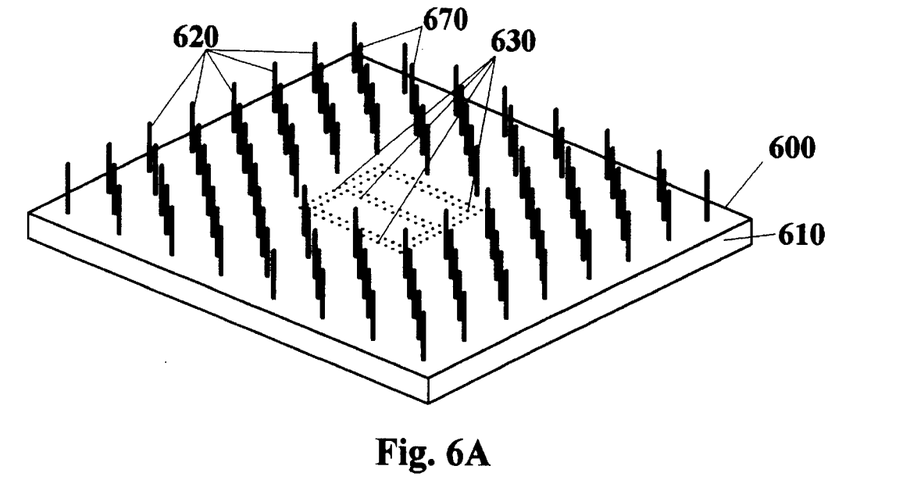
FIG. 6A is an isometric view of a burn-in carrier for an individual IC device die.
Figure 6B:
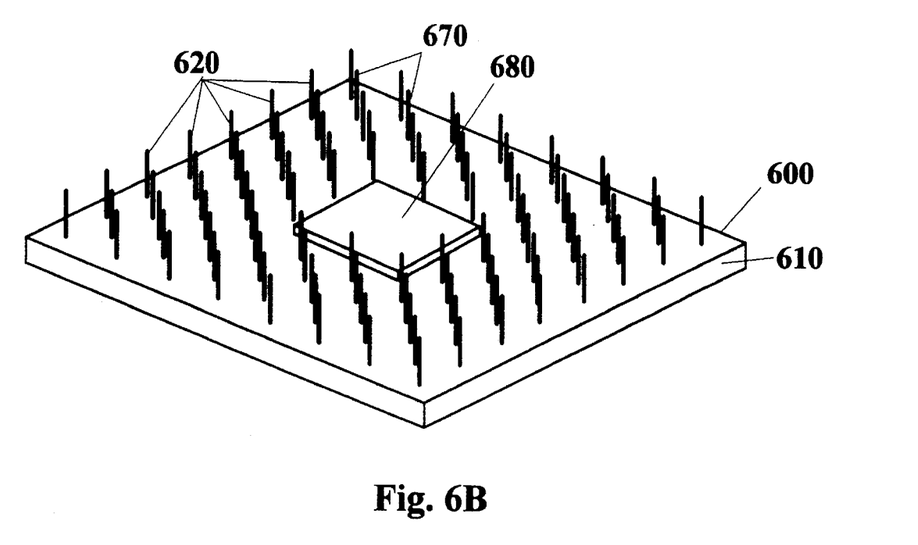
FIG. 6B is an isometric view of the burn-in carrier of FIG. 6A with an IC device die attached.
Figure 6C:
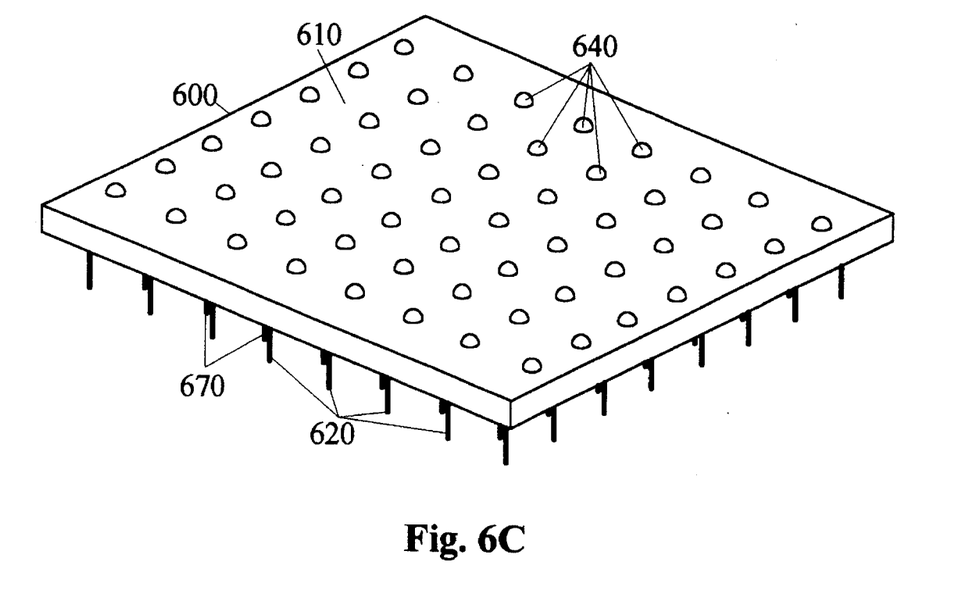
FIG. 6C is an isometric view of the burn-in carrier of FIG. 6A and 6B from another direction.

FIG. 6A is an isometric view of a reusable burn-in carrier 600 for an individual IC device die, FIG. 6B is an isometric view of the same carrier with an IC device die 680 attached, and FIG. 6C is an isometric view of the side of the same carrier not visible in FIGS. 6A or 6B. Carrier 600 has a substrate 610, pins 620, landing pads 630, and contact pads 640. Interstitial pins 670 may be physically identical to pins 620, but are identified separately for clarity in referring to their interstitial positions within the array. The arrangement of landing pads 630 shown in FIG. 6A is representative of a pattern suitable for some IC chips, but of course the pattern of landing pads 630 is adapted to match the IC chip dice to be tested and/or burned-in. Substrate 610 is preferably made of inexpensive organic substrate material such as FR4 printed circuit board. Optionally, in otherwise similar embodiments, contact pads 640 may be replaced by raised Au pads, or by solder bumps, or by additional pins 620, so that carrier 600 has pins on both sides (not shown in FIG. 6A).

Figure 7:
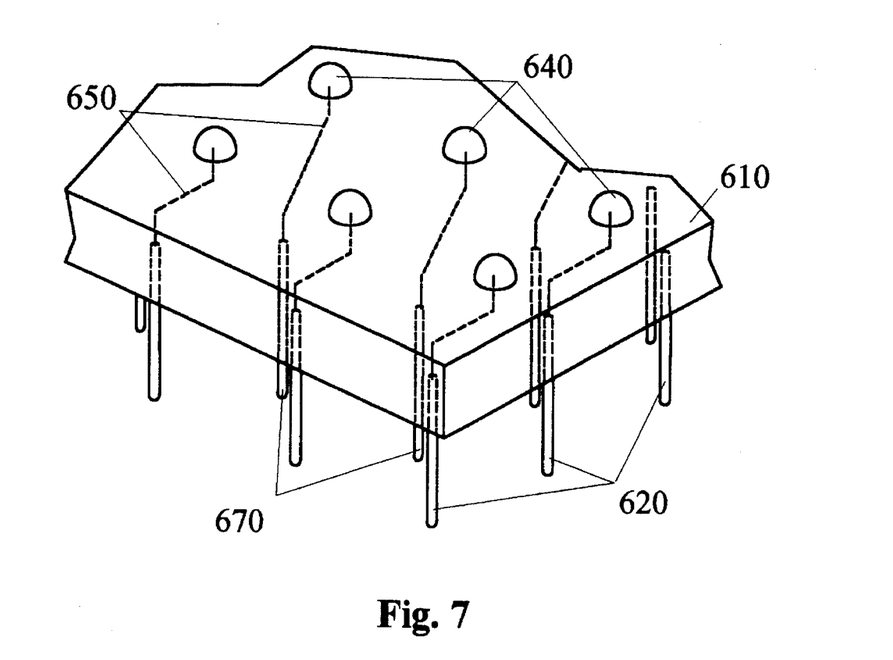
FIG. 7 is a partial cutaway view illustrating a detail of the burn-in carrier of FIGS. 6A–6C.
Figure 8:
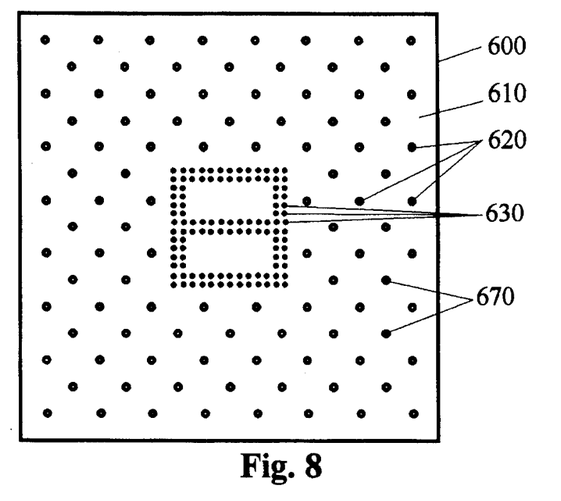
FIG. 8 is a plan view of one side of the burn-in carrier of FIG. 6.
Figure 9:
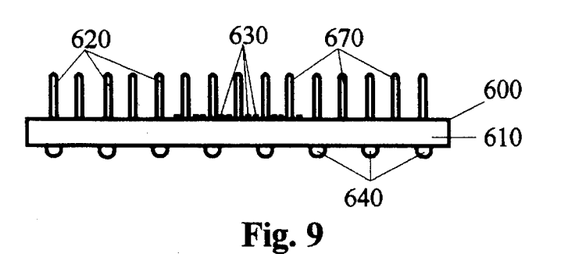
FIG. 9 is a side view of the burn-in carrier of FIG. 6.
Figure 10:
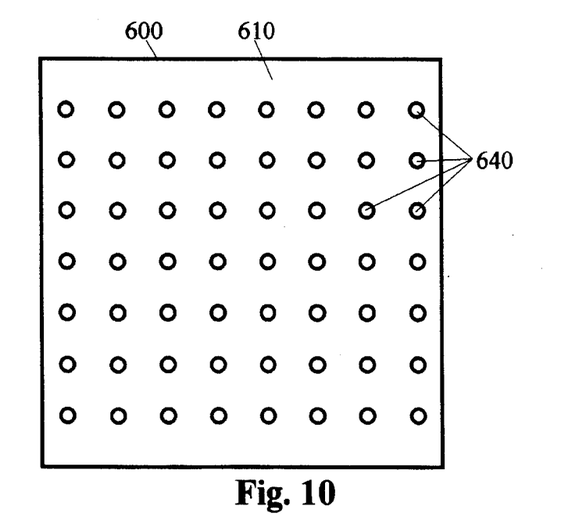
FIG. 10 is a plan view of another side of the burn-in carrier of FIG. 6.

The arrangement of pins 620 and contact pads 640 may be the same on both sides of substrate 610, or may be different, as in the embodiment shown. If the arrangement is the same on both sides, pins 620 may extend directly through via-holes formed in substrate 610. If the arrangement is different on the two sides, one or more internal planes of substrate 610 have interconnections 650 which translate between the pattern of pins 620 and 670 and/or contact pads 640. Such internal interconnections 650 are shown in FIG. 7, which is a partial cutaway view illustrating a detail of the burn-in carrier 600 of FIG. 6. Although FIG. 7 shows internal connections between most pins 620 or 670 and contact pads 640, not all pins 620 or 670 are necessarily connected. Only those power, ground, common or specific I/O connections needed for burn-in testing are connected. Therefore the temporary carrier can have fewer pins, and thus cost less than the permanent package. FIG. 8 is a plan view of one side of the burn-in carrier of FIG. 6. While a certain number and arrangement of pins 620 are shown in FIG. 8, these are intended to be representative of a variety of pin counts, densities, and arrangements. A preferred arrangement of pins 620 is the maximum pin count for a given substrate 610 size, including interstitial pins such as interstitial pins 670. Thus a 36 by 36 pin-grid array with 0.050 inch center-to-center pin spacing, plus additional interstitial pins 670 between pins 620 of the square array is a representative arrangement with a standard inter-pin pitch. FIG. 9 is a side view of the burn-in carrier of FIG. 6. FIG. 10 is a plan view of another side of the burn-in carrier of FIG. 6. While FIG. 10 shows an array of contact pads 640, a second side of substrate 610 may have pins (620 and 670) or pin sockets instead of contact pads 640, and the arrangement need not be the same as on the first side. In particular, the second side may have connector elements (pins or bumps or pads) with a non-standard pitch, such as 0.030 inch pitch, and a different size of pin, bump, or pad from those on the first side. For low cost production, preferred arrangements of connector elements are those that fit industry standard test sockets, such as those commercially available from Amp Incorporated, Aries Electronics, Inc. or Minnesota Mining and Manufacturing Co. (3M).

When reusable burn-in carrier 600 is used in the KGD process of this invention, an IC die 680 is attached to carrier 600 by low-temperature reflow as in steps S290 or S390, and removed after burn-in testing by low-temperature reflow as in steps S295 or S395. Again, those dice which fail burn-in are discarded after removal from carrier 600, and known good dice are continued in processing to completed modules for shipment.

Either full-wafer reusable burn-in carrier 400 or single-die reusable burn-in carrier 600 is used as a test carrier of a wafer 450 or die 680 respectively, in conjunction with the KGD burn-in and test process of this invention as described above and in the appended claims.

Figure 11:
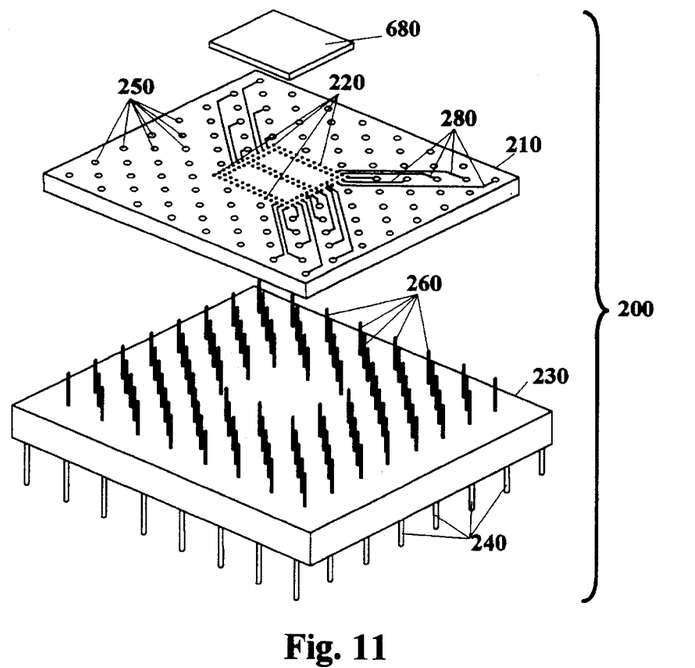
FIG. 11 is an exploded isometric view of a first embodiment of a reusable test carrier structure.

A first embodiment of a reusable test carrier structure 200 made in accordance with the invention is shown in exploded view in FIG. 11. Test carrier structure 200 is a reusable burn in carrier comprising two separable parts, which are temporarily combined for burn-in and test: viz. a personalized test carrier substrate 210 and a universal test carrier platform 230 to which it is temporarily attached. Test carrier platform 230 is fabricated as a universal test carrier platform having maximum pin count for a given size, and preferably has an industry-standard pin arrangement of platform pins 240 on at least one side. For example, platform pins 240 may have a standard 0.100 inch center-to-center pitch, optionally including interstitial pins. Connection pins 260 may have a much finer pitch, such as 0.030 inch, to maximize the area available for flip-chip mounting IC die 680. Test carrier substrate 210 is personalized in that mounting area with landing pads 220 matching the interconnection bump layout of the IC dice 680 to be tested and burned-in. Holes 250 extending through test carrier substrate 210 preferably have metallization on at least a portion of their interior walls, connected to conductive pads on the top surface of substrate 210 and surrounding their upper ends. Holes 250 may be plated through-holes for example. Connection pins 260 may be shorter than the thickness of personalized test carrier substrate 210. It is not generally necessary that all platform pins 240 be electrically connected to metallization of carrier substrate 210. For burn-in and test purposes, many power or ground connections can be tied together electrically. Therefore a lower pin count carrier platform 230 can easily accommodate higher I/O count IC dice, making the present test carrier structure with its universal test carrier platform 230 an attractive alternative to more expensive dedicated test/burn-in carrier packages.

To use this test carrier structure 200, IC die 680 is flip-chip mounted onto test carrier substrate 210 by a low-temperature reflow. Test carrier substrate 210 in turn is mounted onto test carrier platform 230 using mechanical attachment (connection pins 260 inserted into holes 250) or (preferably) by a low-temperature reflow of solder which has an even lower melting temperature.

Figure 12:
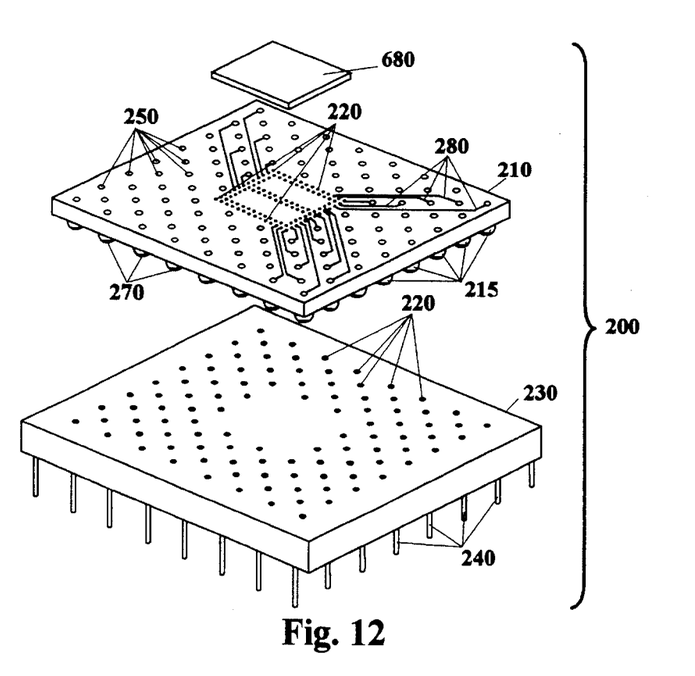
FIG. 12 is an exploded isometric view of a second embodiment of a reusable test carrier structure.

FIG. 12 shows an exploded view of another embodiment of a test carrier structure 200 including a preferred embodiment of test carrier substrate 210, in which the connection pins 260 of FIG. 11 have been replaced with landing pads 220, and the connection holes 250 of FIG. 11 have been replaced with ball grid array bumps 215, each of which has a small amount of low-temperature solder 270 deposited on it. Reflow of low-temperature solder 270 is performed at an even lower temperature than that used in the temporary connection of IC die 680 to test carrier substrate 210. Thus in this preferred embodiment the test carrier structure 200 uses a series of materials within a hierarchy of melting points in combination with improved reusable carrier substrates: the bump material 70 (or 110) of IC die 680 has the highest melting point temperature; die 680 is mounted to personalized test carrier substrate 210 with a solder having a lower melting temperature; and test carrier substrate 210 is preferably mounted to test carrier platform 230 using a solder 270 of still-lower melting point. In the preferred embodiment of FIG. 12, carrier substrate 210 is smaller than carrier platform 230, for ease of assembly and disassembly. Carrier substrate 210 may be made of inexpensive FR4 material, and platform 230 made of low-cost ceramic with brazed or swaged platform pins 240. In some alternate embodiments, especially for low pin counts, and where platform pins 240 and connection pins 260 have the same array dimensions and pitch, carrier platform 230 can also be made of FR4 material.

Figure 13:
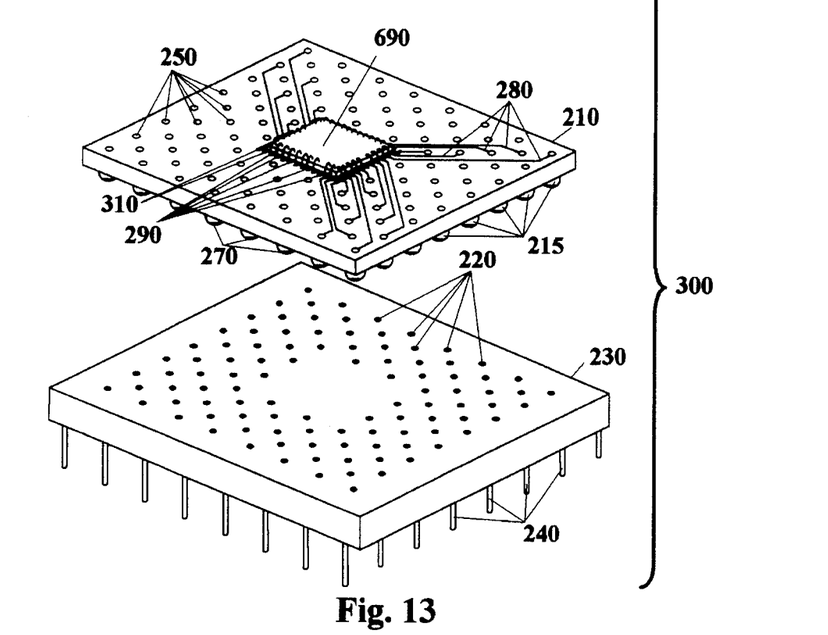
FIG. 13 is an exploded isometric view of an integrated circuit module for wire bonded IC chip dice of various sizes.
Figure 14:
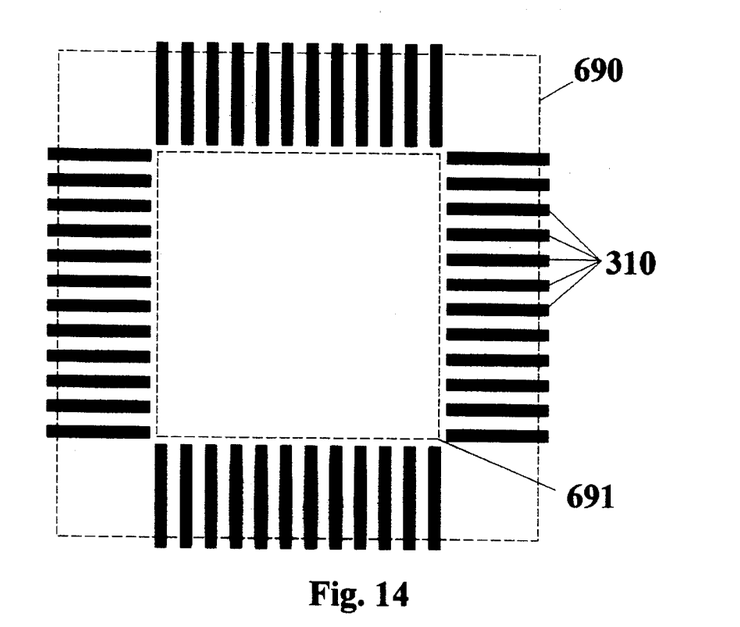
FIG. 14 is a top view of a substrate used in a preferred embodiment of an IC module.

The structures and methods disclosed for burn-in and test may also be used to provide an integrated circuit module for wire bonded IC chips which is capable of handling a wide range of die sizes. FIG. 13 shows an exploded view of such an integrated circuit module 300. In FIG. 13, a wire-bonded IC die 690 is placed on carrier substrate 210 and bonded to wire-bond pads 310 by wire bonds 290. Otherwise, the module of FIG. 13 is similar to the test carrier structure of FIG. 12. The platform 230 may be identical for many sizes and shapes of dice 690. Even the substrate 210 may have a common design for many sizes of dice 690. Wire bond pads 310 may be elongated pads, each extending from an inner end near the periphery of the smallest die 690 to be packaged to an outer end just beyond the periphery of the largest die to be packaged. FIG. 14 shows such a configuration of wire bond pads 310, where die 690 is the largest size die to be packaged, and outline 691 represents the periphery of the smallest IC die to be packaged. If IC die 690 in FIG. 13 were the largest IC die to be packaged, the portions of wire bond pads visible in the FIG. 13 would be the outer ends, and the inner ends for accommodating the smallest die size would be covered by die 690. Thus for example the module of FIG. 13 could be used for a large IC die 690, and when improvements were made to shrink that die to a higher density and smaller size, the same module package 300 could be used. The wire bonds would then be made at points on wire bond pads 310 closer to the center of substrate 210. If desired, a conventional encapsulant may be used for covering and protecting at least the dice and the wire bonds.

Other embodiments of the invention will be apparent to those skilled in the art from a consideration of this specification or from practice of the invention disclosed herein. For example, it will be understood by those of ordinary skill in the art that burn-in carrier 600 may be configured to carry more than one die 680 for burn-in and testing, if desired, as in hybrid packaging. If that is done, it is necessary to identify those dice which fail burn-in and discard them after they are removed from their burn-in carriers, so that only known good dice can be continued in normal processing. It is intended that the specification and examples be considered as exemplary only, with the true scope and spirit of the invention being defined by the following claims.

Having described my invention, I claim:

1. A burn-in and test process for integrated circuit chips prior to final packaging, comprising the steps of:
   a) providing integrated circuit chips having metallic interconnection bumps before any reflow or annealing of said bumps, said bumps having a melting point above a predetermined temperature and each of said bumps having a characteristic bump volume,
   b) depositing a limited amount of solder having a melting point below said predetermined temperature to each of said bumps, while controlling said limited amount to be less than one-tenth of said characteristic bump volume,
   c) providing test carriers to temporarily carry and interconnect said chips by flip-chip mounting, and
   d) mounting said integrated circuit chips to said test carriers for burn-in and test by reflowing said solder at a temperature below said predetermined temperature.

2. A burn-in and test process for integrated circuit chips prior to final packaging as in claim 1, further comprising the steps of:
   e) performing burn-in and tests while said chips are temporarily carried on said test carriers until at least some of said chips are determined to be good chips,
   f) identifying as failed chips any chips not determined to be good chips, and g) removing said failed chips from said test carriers by reflow of said solder below said predetermined temperature, thereby freeing said test carriers for re-use.

3. A burn-in and test process for integrated circuit chips prior to final packaging as in claim 2, further comprising the steps of:

h) determining whether said test carriers shall continue to carry said good chips in their final package, and i) if so, fixing said good chips to said substrates by reflowing said bumps above said predetermined temperature, and j) if not, removing said good chips from said test carriers by lifting said good chips while reflowing said solder below said predetermined temperature, thereby freeing said test carriers for re-use and freeing said good chips for mounting in a final package.

4. A burn-in and test process for integrated circuit chips prior to final packaging as in claim 1, wherein said depositing step (b) is performed by plating.

5. A burn-in and test process for integrated circuit chips prior to final packaging as in claim 1, wherein said depositing step (b) is performed by wave soldering.

6. A burn-in and test process for integrated circuit chips prior to final packaging as in claim 1, wherein said depositing step (b) is performed by sputtering.

7. A burn-in and test process for integrated circuit chips prior to final packaging as in claim 1, wherein said depositing step (b) is performed by evaporation.

8. A burn-in and test process for integrated circuit chips prior to final packaging as in claim 1, wherein said integrated circuit chips each have a bump mask and wherein said chip providing step (a) includes leaving said bump mask in place on said integrated circuit chips.

9. A burn-in and test process for integrated circuit chips prior to final packaging as in claim 1, wherein said chip providing step (a) comprises providing said chips in the form of an undiced wafer, and said test carrier providing step (c) comprises providing a test carrier adapted to carry a full semiconductor wafer.

10. A test carrier structure for burn-in and test of integrated circuit chips or wafers having metallic contacts characterized by a first melting point, comprising:

a) a test carrier first substrate having:

i) pads wettable by a first solder characterized by a second melting point below a predetermined temperature, which is in turn below said first melting point of said metallic contacts, thereby being adapted to accept flip-chip mounting of said chips or wafers by reflow of said first solder below said predetermined temperature, and ii) first conductive terminals electrically connected to said solder-wettable pads, and b) a test carrier platform comprising:

i) a second substrate having first and second major surfaces, ii) a multiplicity of second conductive terminals attached to said first major surface and disposed to match said first conductive terminals of said test carrier first substrate, iii) a multiplicity of third conductive terminals attached to said second major surface and disposed to mate with a standard test socket, and iv) conductive connections between selected terminals of said multiplicity of second conductive terminals and selected terminals of said multiplicity of third conductive terminals, said first conductive terminals being temporarily connected to said second conductive terminals, thereby fastening said test carrier first substrate to said test carrier platform to provide electrical connections from said solder-wettable pads to said standard test socket.

11. A test carrier structure for burn-in and test of integrated circuit chips or wafers as in claim 10, wherein said first conductive terminals comprise through holes having inner wall surfaces, and said inner wall surfaces are coated with conductive material.

12. A test carrier structure for burn-in and test of integrated circuit chips or wafers as in claim 10, wherein said second conductive terminals comprise conductive pins.

13. A test carrier structure for burn-in and test of integrated circuit chips or wafers as in claim 10, wherein said first conductive terminals comprise conductive pins.

14. A test carrier structure for burn-in and test of integrated circuit chips or wafers as in claim 10, wherein said first conductive terminals comprise conductive bumps.

15. A test carrier structure for burn-in and test of integrated circuit chips or wafers as in claim 10, wherein said second conductive terminals comprise conductive bumps.

16. A test carrier structure for burn-in and test of integrated circuit chips or wafers as in claim 10, wherein said third conductive terminals comprise conductive pins.

17. A test carrier structure for burn-in and test of integrated circuit chips or wafers as in claim 10 wherein said third conductive terminals comprise conductive bumps.

18. A test carrier structure for burn-in and test of integrated circuit chips or wafers as in claim 10, wherein said test carrier first substrate is adapted to accept mounting of a semiconductor integrated circuit wafer.

19. A test carrier structure for burn-in and test of integrated circuit chips or wafers as in claim 10, wherein said test carrier first substrate is adapted to accept a single integrated circuit chip die.

20. A test carrier structure for burn-in and test of integrated circuit chips or wafers as in claim 10, wherein said test carrier first substrate is adapted to accept a multiplicity of integrated circuit chip dice.

21. A test carrier structure for burn-in and test of integrated circuit chips or wafers as in claim 10, wherein said test carrier platform further comprises a pin grid array package format.

22. A test carrier structure for burn-in and test of integrated circuit chips or wafers as in claim 10, wherein said test carrier platform further comprises a ball grid array package format.

23. A test carrier structure for burn-in and test of integrated circuit chips or wafers as in claim 10, wherein said test carrier platform further comprises a flat pack package format.

24. A test carrier structure for burn-in and test of integrated circuit chips or wafers as in claim 10, wherein said test carrier platform further comprises a surface mount package format.

25. A test carrier structure for burn-in and test of integrated circuit chips or wafers as in claim 11, wherein said connection of said test carrier first substrate to said test carrier package is made by insertion of said second conductive terminals into said through holes in said test carrier first substrate.

26. An integrated circuit module capable of accommodating a range of sizes of integrated circuit dice of the type using wire bond interconnections, comprising:

a) one or more integrated circuit dice having die wire bond pads, b) a first substrate having top and bottom major surfaces, said top major surface supporting said integrated circuit dice, and having substrate wire bond pads on said top major surface, said substrate wire bond pads being electrically connected through said first substrate to first conductive terminals on said bottom major surface, c) wire bonds selectively connecting said die wire bond pads to said substrate wire bond pads, d) a platform comprising:
  i) a second substrate having first and second major surfaces,
  ii) a multiplicity of second conductive terminals attached to said first major surface and disposed to match said first conductive terminals on said bottom major surface of said first substrate, and to support said first substrate,
  iii) a multiplicity of third conductive terminals attached to said second major surface, and
  iv) conductive connections through said second substrate between selected ones of said multiplicity of second conductive terminals and selected ones of said multiplicity of third conductive terminals, and e) soldered connections between said first conductive terminals and said second conductive terminals to complete interconnections from said die wire bond pads to said third conductive terminals.

27. An integrated circuit module as in claim 26, wherein said substrate wire bond pads are elongated, having inner ends and outer ends, said inner ends are disposed to match the perimeter of the smallest die to be packaged, and said outer ends are disposed to extend outside the perimeter of the largest die to be packaged.

28. An integrated circuit module as in claim 26, wherein said third conductive terminals comprise conductive pins.

29. An integrated circuit module as in claim 26, wherein said third conductive terminals comprise conductive bumps.

30. A test carrier structure for burn-in and test of integrated circuit chips having metallic contacts characterized by a first melting point while accommodating a range of sizes of integrated circuit dice of the type using wire bond interconnections, comprising:

a) a test carrier first substrate having top and bottom major surfaces, said top major surface supporting said integrated circuit dice, and having substrate wire bond pads on said top major surface, said substrate wire bond pads being electrically connected through said first substrate to first conductive terminals on said bottom major surface, said first conductive terminals being wettable by a first solder characterized by a second melting point below a predetermined temperature, which is in turn below said first melting point of said metallic contacts, and b) a test carrier platform comprising:
  i) a second substrate having first and second major surfaces,
  ii) a multiplicity of second conductive terminals attached to said first major surface and disposed to match said first conductive terminals of said test carrier first substrate,
  iii) a multiplicity of third conductive terminals attached to said second major surface and disposed to mate with a standard test socket, and
  iv) conductive connections between selected terminals of said multiplicity of second conductive terminals and selected terminals of said multiplicity of third conductive terminals, said first conductive terminals being temporarily connected to said second conductive terminals by reflow of said first solder below said predetermined temperature, thereby fastening said test carrier first substrate to said test carrier platform to provide electrical connections from said substrate wire-bond pads to said standard test socket.

31. A test carrier structure for burn-in and test of integrated circuit chips as in claim 30, wherein said wire bond pads are elongated, having inner ends and outer ends, said inner ends are disposed to match the perimeter of the smallest die to be burned-in and tested, and said outer ends are disposed to extend outside the perimeter of the largest die to be burned-in and tested.

32. A test carrier structure for burn-in and test of integrated circuit chips or wafers having metallic contacts characterized by a first melting point, comprising:

a) an insulating test carrier substrate having first and second major surfaces, b) landing pads on said first major surface of said substrate, said landing pads being wettable by a first solder characterized by a second melting point below a predetermined temperature, which is in turn below said first melting point of said metallic contacts, thereby being adapted to accept temporary flip-chip mounting of said chips or wafers by reflow of said first solder below said predetermined temperature, c) a first multiplicity of first conductive contact terminals electrically connected to selected ones of said landing pads and disposed on said first major surface of said substrate, d) a second multiplicity of second conductive contact terminals disposed to mate with a standard test socket, and e) conductive connections between selected terminals of said first multiplicity of first conductive contact terminals and selected contact terminals of said second multiplicity of second conductive contact terminals, thereby selectively providing electrical connections from said landing pads to said standard test socket.

33. A test carrier structure as recited in claim 32, wherein said insulating test carrier substrate is adapted to accept a wafer on at least said first major surface, and said second multiplicity of second conductive contact terminals comprise edge-connector terminals.

34. A test carrier structure as recited in claim 32, wherein said second multiplicity of second conductive contact terminals comprise conductive bumps disposed in a ball grid array projecting from said second major surface.

35. A test carrier structure as recited in claim 32, wherein said second multiplicity of second conductive contact terminals comprise conductive bumps disposed in a ball grid array projecting from said first major surface.

36. A test carrier structure as recited in claim 32, wherein said second multiplicity of second conductive contact terminals comprise conductive pins disposed in a pin grid array projecting from said second major surface.

37. A test carrier structure as recited in claim 32, wherein said second multiplicity of second conductive contact terminals comprise conductive pins disposed in a pin grid array projecting from said first major surface.

38. A test carrier structure for burn-in and test of integrated circuit chips or wafers having metallic contacts characterized by a first melting point, comprising:

a) a test carrier first substrate having:
  i) pads wettable by a first solder characterized by a second melting point below a predetermined temperature, which is in turn below said first melting point of said metallic contacts, thereby being adapted to accept flip-chip mounting of said chips or wafers by reflow of said first solder below said predetermined temperature; and ii) first conductive terminals electrically connected to said first-solder-wettable pads; and b) a test carrier platform comprising:
i) a second substrate having first and second major surfaces,
ii) a multiplicity of second conductive terminals attached to said first major surface and disposed to match said first conductive terminals of said test carrier first substrate,
iii) a multiplicity of third conductive terminals attached to said second major surface and disposed to mate with a standard test socket, and
iv) conductive connections between selected terminals of said multiplicity of second conductive terminals and selected terminals of said multiplicity of third conductive terminals;

said first conductive terminals of said test carrier first substrate being temporarily connected by a second solder to said multiplicity of second conductive terminals of said test carrier platform; and said second solder having a third melting point below said second melting point of said first solder, thereby fastening said test carrier first substrate to said test carrier platform to provide electrical connections from said first-solder-wettable pads to said standard test socket.

39. A test carrier structure for burn-in and test of integrated circuit chips or wafers as recited in claim 38, wherein said test carrier first substrate comprises a material selected from the list consisting of printed circuit board material, organic material, ceramic material, ceramic composite material, mullite, and silicon carbide.

40. A test carrier structure for burn-in and test of integrated circuit chips or wafers as recited in claim 38, wherein said second substrate further comprises a material selected from the list consisting of printed circuit board material, organic material, ceramic material, ceramic composite material, mullite, and silicon carbide.

41. A burn-in and test process for integrated circuit chips prior to final packaging, comprising the steps of:

a) providing integrated circuit chips having first solder bumps, said first solder bumps being of a first solder characterized by a first melting point;

b) providing test carriers to temporarily carry and interconnect said chips, said test carriers having:
i) first pads wettable by said first solder,
ii) second pads wettable by a second solder, said second solder being characterized by a second melting point lower than said first melting point, and
iii) conductive interconnections between selected first pads and selected second pads;

c) mounting said integrated circuit chips to said first pads of said test carriers by reflow of said first solder at a temperature at least equal to said first melting point;

d) providing carrier platforms, said carrier platforms having second solder bumps of said second solder; and e) mounting said test carriers to said carrier platforms by reflowing said second solder at a temperature below said first melting point to provide connections for burn-in and test of said integrated circuit chips.

42. A burn-in and test process for integrated circuit chips prior to final packaging, comprising the steps of:

a) providing a test carrier first substrate having:
i) pads wettable by a first solder characterized by a second melting point below a predetermined temperature, which is in turn below said first melting point of said metallic contacts, thereby being adapted to accept flip-chip mounting of said chips or wafers by reflow of said first solder below said predetermined temperature, and
ii) first conductive terminals electrically connected to said first-solder-wettable pads;

b) providing a test carrier platform having:
i) a second substrate having first and second major surfaces,
ii) a multiplicity of second conductive terminals attached to said first major surface and disposed to match said first conductive terminals of said test carrier first substrate,
iii) a multiplicity of third conductive terminals attached to said second major surface and disposed to mate with a standard test socket, and
iv) conductive connections between selected terminals of said multiplicity of second conductive terminals and selected terminals of said multiplicity of third conductive terminals; and c) temporarily connecting said first conductive terminals of said test carrier first substrate to said test carrier platform by reflowing a second solder to wet said multiplicity of second conductive terminals of said test carrier platform, said second solder having a third melting point below said second melting point of said first solder, and said second-solder reflowing being performed at a temperature below said second melting point of said first solder, thereby fastening said test carrier first substrate to said test carrier platform to provide electrical connections from said solder-wettable pads to said standard test socket for burn-in and test.

* * * * *